(12) United States Patent
Zink

(10) Patent No.: US 9,046,578 B2
(45) Date of Patent: Jun. 2, 2015

(54) VARIABLE ROTATABLE MR COIL

(75) Inventor: Stephan Zink, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 444 days.

(21) Appl. No.: 13/475,971

(22) Filed: May 19, 2012

(65) Prior Publication Data
US 2012/0293176 A1   Nov. 22, 2012

(30) Foreign Application Priority Data
May 19, 2011   (DE) .......................... 10 2011 076 119

(51) Int. Cl.
*G01V 3/00* (2006.01)
*G01R 33/34* (2006.01)
*G01R 33/3415* (2006.01)

(52) U.S. Cl.
CPC .... *G01R 33/34084* (2013.01); *G01R 33/34007* (2013.01); *G01R 33/3415* (2013.01)

(58) Field of Classification Search
CPC ................................................ G01R 33/34084
USPC .................................... 324/318, 322; 600/422
See application file for complete search history.

(56) References Cited

U.S. PATENT DOCUMENTS

| | | | | |
|---|---|---|---|---|
| 5,307,806 A | * | 5/1994 | Jones | 600/422 |
| 5,477,146 A | * | 12/1995 | Jones | 324/318 |
| 6,943,551 B2 | | 9/2005 | Eberler et al. | |
| 7,365,542 B1 | | 4/2008 | Rohling et al. | |
| 7,646,199 B2 | | 1/2010 | Dannels et al. | |

FOREIGN PATENT DOCUMENTS

DE   103 14 215 B4   11/2006

OTHER PUBLICATIONS

German Office Action dated Feb. 15, 2012 for corresponding German Patent Application No. DE 10 2011 076 119.5 with English translation.

* cited by examiner

*Primary Examiner* — Louis Arana
(74) *Attorney, Agent, or Firm* — Lempia Summerfield Katz LLC

(57) ABSTRACT

A local coil for a magnetic resonance tomography system includes a plurality of coil elements. Each coil element of the plurality of coil elements has a point of application for another coil element of the plurality of coil elements. The coil element is connected to the other coil element at the point of application in a pivoting manner with respect to the coil element.

22 Claims, 6 Drawing Sheets

FIG 6
A)
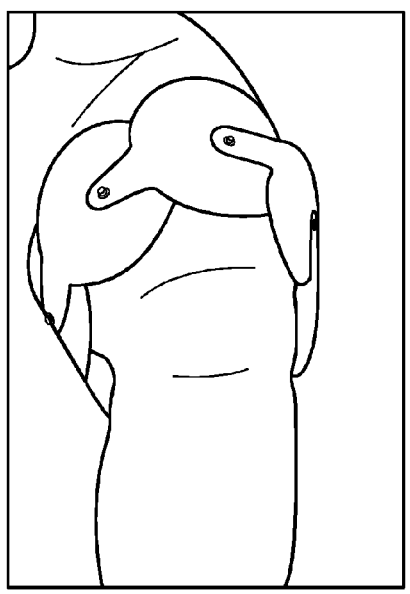
B)
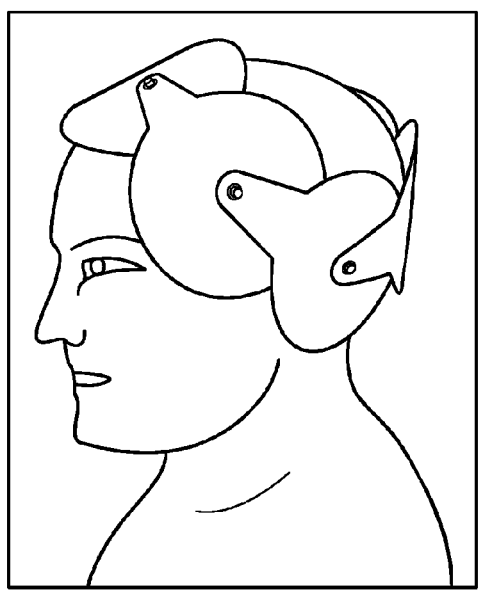
C)
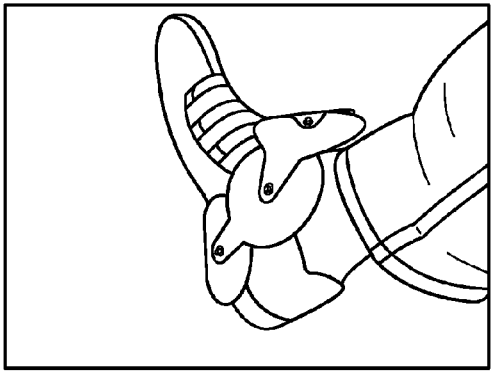
D)
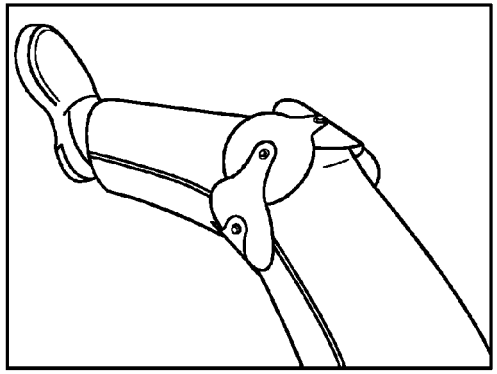

US 9,046,578 B2

VARIABLE ROTATABLE MR COIL

This application claims the benefit of DE 10 2011 076 119.5, filed on May 19, 2011.

BACKGROUND

The present embodiments relate to a magnetic resonance tomography (MRT) local coil for an MRT system.

Magnetic resonance tomography equipment for scanning objects or patients by magnetic resonance tomography (MRT, MRI) are known, for example, from DE10314215B4 and U.S. Pat. No. 7,646,199 B2.

SUMMARY

The present embodiments may obviate one or more of the drawbacks or limitations in the related art. For example, an MRT local coil may be further optimized.

The present embodiments enable a local coil to be used in an alternative manner as flexible coils (e.g., flex coils) on patients of different body shape.

BRIEF DESCRIPTION OF THE DRAWINGS

FIG. 3 shows a plan view of one embodiment of a local coil including six coil elements each connected to one coil element or two coil elements, one coil element being swiveled compared to FIG. 2a;

FIGS. 6a-d show perspective views of the use of one embodiment of the local coil of FIG. 2, which is closed to form a circle, on a shoulder, head, ankle and knee joint of an examination subject.

DETAILED DESCRIPTION OF THE DRAWINGS

Figure 7:
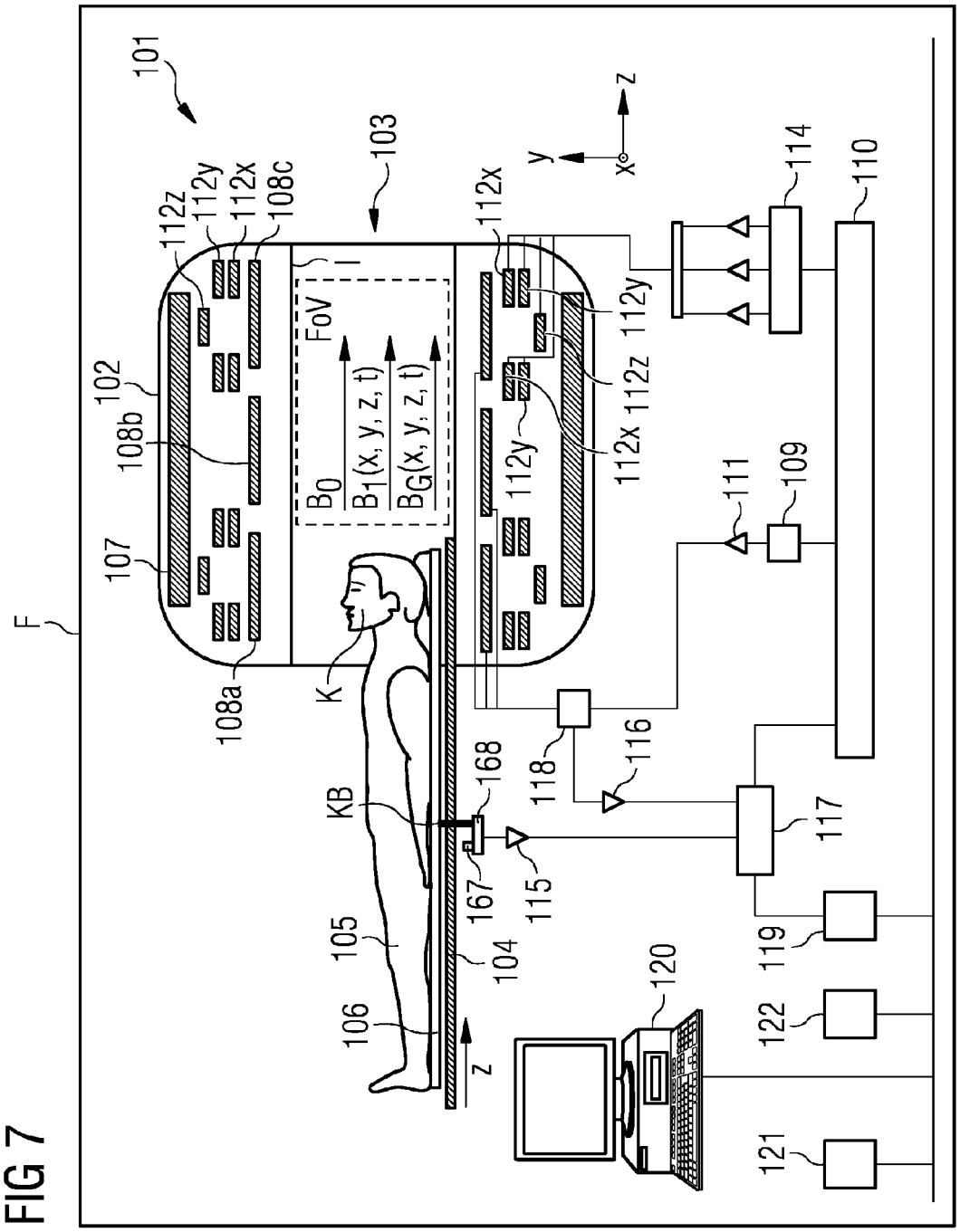
FIG. 7 schematically illustrates an MRT system.

FIG. 7 shows a magnetic resonance tomography (MRT) scanner 101 (e.g., installed in a shielded room or Faraday cage F) including a body coil 102 with, for example, a tubular cavity 103, into which a patent table 104 with a body 105 (e.g., of an examination subject such as a patient; with or without a local coil arrangement 106) may be moved in the direction of the arrow z so that scans of the patient 105 may be generated by an imaging method. In FIG. 7, the local coil arrangement 106, with which, in a local area (e.g., a field of view (FOV)) of the scanner, scans of a portion of the body 105 in the FOV may be generated, may be disposed on the patient. Signals from the local coil arrangement 106 may be processed (e.g., converted into images, stored or displayed) by a processing device (e.g., including elements 168, 115, 117, 119, 120, 121) of the MRT scanner 101 that may be connected to the local coil arrangement 106 (e.g., via coaxial cable or radio (e.g., element 167)).

In order to examine the body 105 (e.g., the examination subject or the patient) by magnetic resonance imaging using the MRT scanner 101, different magnetic fields ultra-finely tuned to one another with respect to temporal and spatial characteristic are radiated onto the body 105. A powerful magnet (e.g., a cryomagnet 107) in an examination cabin with, for example, a tunnel-shaped bore 103 produces a powerful static primary magnetic field $B_0$ of, for example, 0.2 to 3 teslas or even more. The body 105 to be examined is placed on a patient positioning table 104 that is moved into a region of the primary magnetic field B0 that is approximately homogeneous in the FoV. The nuclear spin of atomic nuclei of the body 105 is excited via radiofrequency magnetic pulses B1 (x, y, z, t) that are radiated in via a radiofrequency antenna (and/or a local coil arrangement) shown in FIG. 7 in a simplified manner as a body coil 108 (e.g., a radiofrequency antenna; a multi-section body coil 108a, 108b, 108c). Radiofrequency excitation pulses are produced, for example, by a pulse generating unit 109 that is controlled by a pulse sequence control unit 110. After amplification by a radiofrequency amplifier 111, the radiofrequency excitation pulses are fed to the radiofrequency antenna 108. The radiofrequency system shown in FIG. 7 is indicated schematically. In some embodiments, more than one pulse generating unit 109, more than one radiofrequency amplifier 111 and a plurality of radiofrequency antennas 108 a, b, c are used in an a magnetic resonance scanner 101.

The magnetic resonance scanner 101 has also includes gradient coils 112 x, 112 y, 112 z, with which magnetic gradient fields for selective slice excitation and local encoding of the scanning signal are radiated in during a scan. The gradient coils 112x, 112y, 112z are controlled by a gradient coil control unit 114 that, like the pulse generating unit 109, is connected to the pulse sequence control unit 110.

Signals emitted by the excited nuclear spin (e.g., of the atomic nuclei in the examination subject) are received by the body coil 108 and/or at least one local coil arrangement 106, amplified by associated radiofrequency preamplifiers 116, and further processed and digitized by a receive unit 117. The scanning data recorded is digitized and stored as complex numerical values in a k-space matrix. An associated MR image may be reconstructed from the k-space matrix populated with values using a multidimensional Fourier transformation.

For a coil that may be operated in both transmit and receive mode (e.g., the body coil 108 or a local coil), correct signal forwarding is regulated by an upstream duplexer 118.

An imaging processing unit 119 uses the measurement data to produce an image that is displayed to a user on an operating console 120 and/or stored in a storage unit 121. A central computer unit 122 controls the individual system components.

In MR tomography, images with a high signal-to-noise ratio (SNR) may be obtained using local coil arrangements. The local coil arrangements are antenna systems that are positioned in direct proximity to (anterior), below (posterior), on or in the body. During an MR scan, the excited nuclei induce in the individual antennas of the local coil a voltage that is amplified using a low-noise preamplifier (e.g., LNA, preamp) and forwarded to the receive electronics. To improve the SNR, even in the case of high-resolution images, highfield systems (e.g., 1.5 T or more) are used. If more individual antennas may be connected to an MR receive system than there are receivers present, a switching matrix (e.g., RCCS) is inserted between the receive antennas and the receiver. This switching matrix routes the instantaneously active receive channels (e.g., the receive channels in the FoV of the magnet at the time) to the receivers present. This allows more coils to be connected than there are receivers present, since with whole body coverage, only the coils located in the FoV or in the homogeneity volume of the magnet are to be read out.

The term local coil arrangement 106 may, for example, be applied to an antenna system that may include, for example, one or a plurality of antenna elements (e.g., coil elements; as an array coil). The individual antenna elements are implemented, for example, as loop antennas (loops), butterfly coils, flex coils or saddle coils. A local coil arrangement includes, for example, coil elements, a preamplifier, additional electronics (e.g., sheath current chokes), a housing, supports and may include a cable with a connector for connecting the cable to the MRT system. A receiver 168 installed at the system end filters and digitizes a signal received, for example, wirelessly from a local coil 106 and transfers the data to a digital signal processing device that mainly derives an image or a spectrum from the data obtained from the scan. The digital signal processing device makes the image or the spectrum available to the user (e.g., for subsequent diagnosis by the user and/or for storage).

A number of advantageous details of exemplary embodiments of MRT local coils according to the present embodiments are explained in greater detail with reference to FIGS. 1-6.

A coil concept according to the present embodiments achieves good adaptation of a local coil 106 to suit different body geometries and body regions (e.g., with respect to wide area coverage of a body region to be examined).

Figure 1:
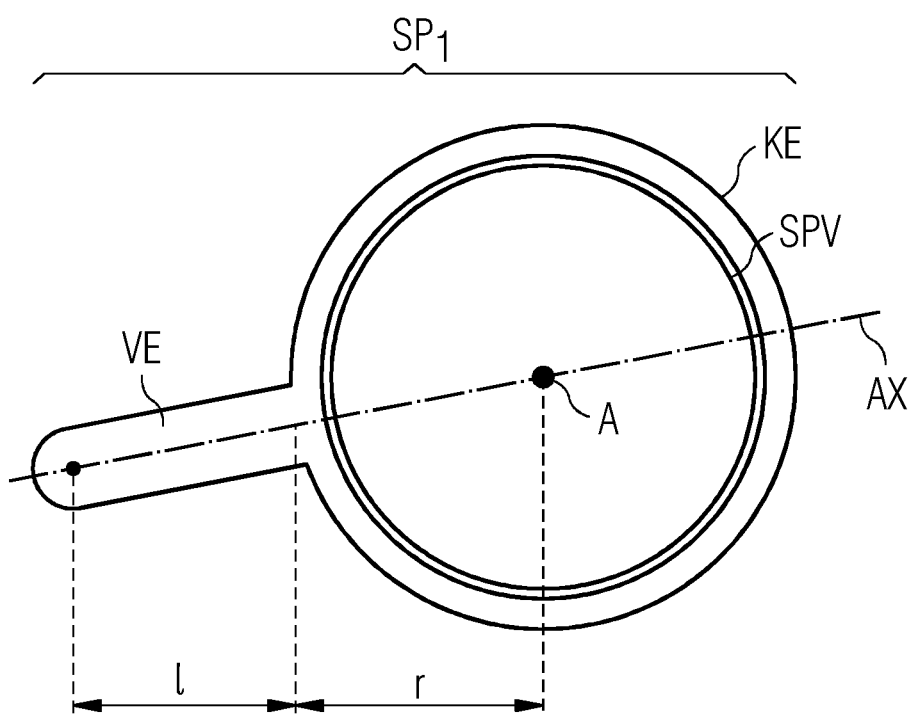
FIG. 1 shows a plan view of one embodiment of a coil element of a local coil.

FIG. 1 shows a basic element SP1 (e.g., a coil element) of a variable MR coil 106. The coil element SP1, which will hereinafter also be referred to as an individual loop (e.g., SP1, SP2, SP3, SP4, SP5, SP6, SP7), has in each case a point of application A (e.g., in the form of a cutout) for another coil element (e.g., SP2, SP3, SP4, SP5, SP6, SP7) that may be mounted pivotally (e.g., in the drawing plane) thereon. As a point of application A, as shown in FIG. 1, a cutout in an (e.g., in plan view) approximately circular sub-area KE of the coil element SP1 is provided. In FIG. 1 (and FIG. 2), another cutout in an (e.g., in plan view) oblong (e.g., longer than wide) sub-area VE of the coil element SP1 is provided.

Figure 2:
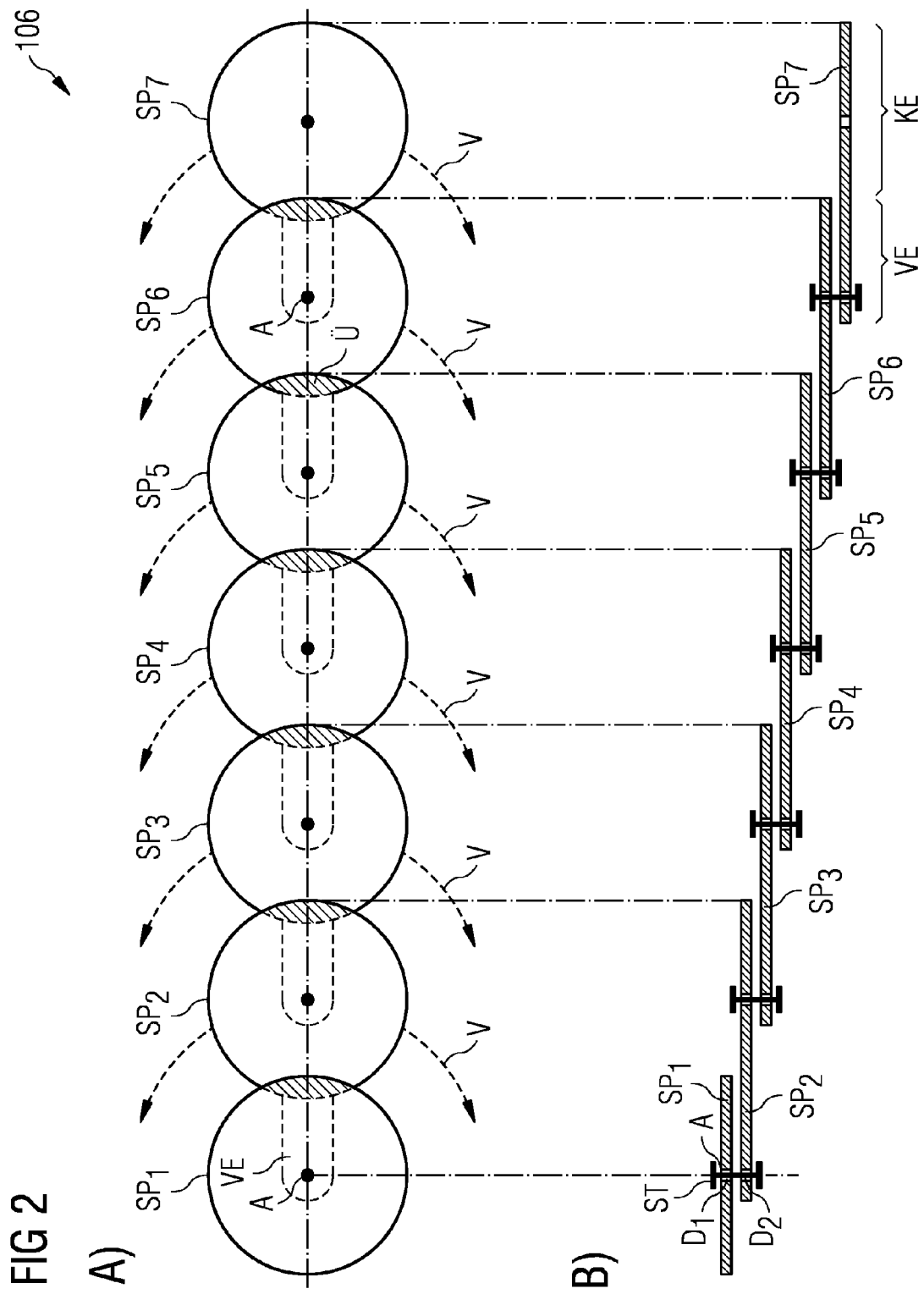
FIG. 2a shows a plan view of one embodiment of a local coil including seven coil elements each connected to one coil element or two coil elements.
FIG. 2b shows a cross-sectional view of one embodiment of a local coil including seven coil elements each connected to one coil element or two coil elements.

Two coil elements SP1, SP2 may be interconnected, for example, as shown in FIG. 2 by inserting a pin (e.g., ST in FIG. 2) through a cutout D1 in the (in plan view) approximately circular sub-area KE of the coil element SP1 and through another cutout D2 in the (in plan view) oblong sub-area VE of another coil element SP2 and securing the pin against slipping out with a cap, for example, at a free end. As a result, the coil element SP1 is connected to the other coil element SP2 in a rotating manner (e.g., pivots through three hundred and sixty degrees or more) about a point of application A with respect to the other coil element SP2 (e.g., in the direction of the arrow V in FIG. 2).

In the approximately circular sub-area KE of a coil element SP1-SP7, a, for example, annular antenna SPV for transmitting and/or receiving signals to or from the object under examination 105 is provided.

FIG. 2 shows a plurality of individual loops SP1, SP2, SP3, SP4, SP5, SP6, SP7 that are connected in a rotating manner and pivotally with respect to one another (e.g., in the drawing plane) such that a resulting overlap Ü remains the same even in the event of twisting (e.g., of the individual loops with respect to one another). The overlap of the individual loops SP1, SP2, SP3, SP4, SP5, SP6, SP7 is adjusted such that the individual loops SP1, SP2, SP3, SP4, SP5, SP6, SP7 are decoupled from one another as disclosed above.

In the embodiment in FIG. 2, two coil elements SP1, SP7 are rotatably connected to only one other coil element SP2, SP6 about their own point of application A in order to form a chain of individual loops SP1, SP2, SP3, SP4, SP5, SP6, SP7. An individual loop chain (e.g., SP1, SP2, SP3, SP4, SP5, SP6, SP7 in FIG. 2) may be formed manually into different shapes without great application of force, with the overlap remaining the same.

Figure 3:
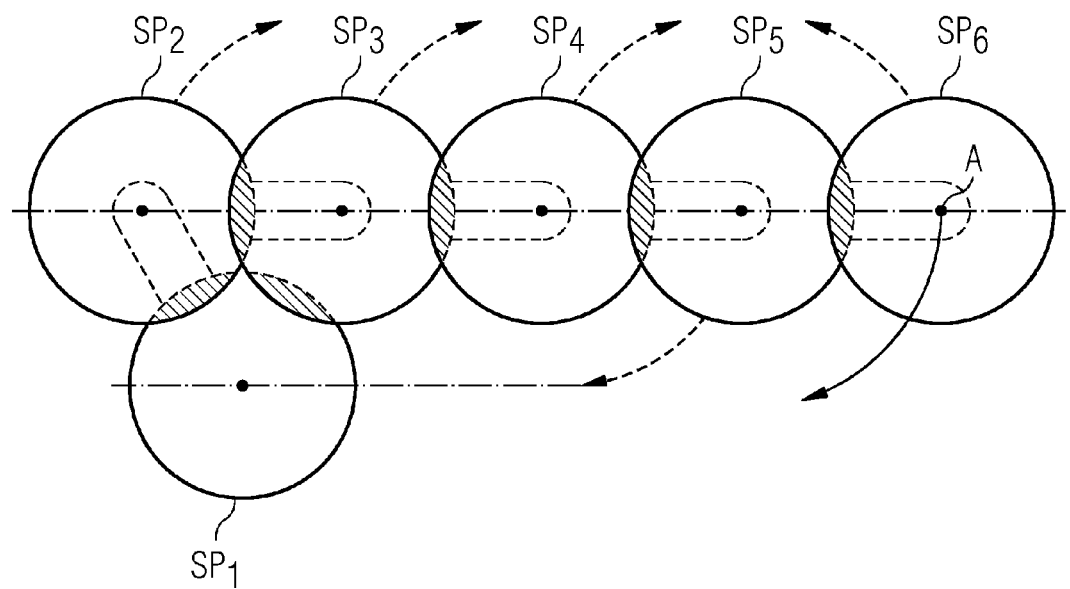

FIG. 3 shows an example of a local coil 106 in a partially oblong arrangement (e.g., suitable for scanning an abdomen). In FIG. 3, a second row (e.g., including only SP1) facing the first row in a defined parallel manner may be produced, for example, by folding the loop chain over as in FIG. 3 (e.g., a second row of one or more individual loops, such as SP1, below an upper row of a plurality of individual loops, such as SP2-SP6).

When individual loops SP1, SP2, SP3, SP4, SP5, SP6, SP7 are rotated relative to one another, new areas of overlaps Ü of interconnected individual loops SP1, SP2, SP3, SP4, SP5, SP6, SP7 are formed one above the other, the surface area of which may be and may remain equal to a preset overlap of the individual loops SP1, SP2, SP3, SP4, SP5, SP6, SP7 above one other. The twisting of the individual loops relative to one another may be guided and/or limited, for example, via a stop or a locking point. Velcro points may, for example, help to provide fixing in a respective end position.

Other shapes may be implemented from the twisted arrangement of the individual loops SP1, SP2, SP3, SP4, SP5, SP6, SP7.

If the two end individual loops SP1, SP7 shown in FIG. 2 (e.g., connected to only one other coil element SP2, SP6 in a rotating manner about their own point of application A) are interconnected (e.g., using a pin ST through cutouts D1, D2), an annular arrangement of the individual loops SP1, SP2, SP3, SP4, SP5, SP6, SP7 is produced as shown in FIGS. 5*a-c*, 6*a-d*.

Figure 5:
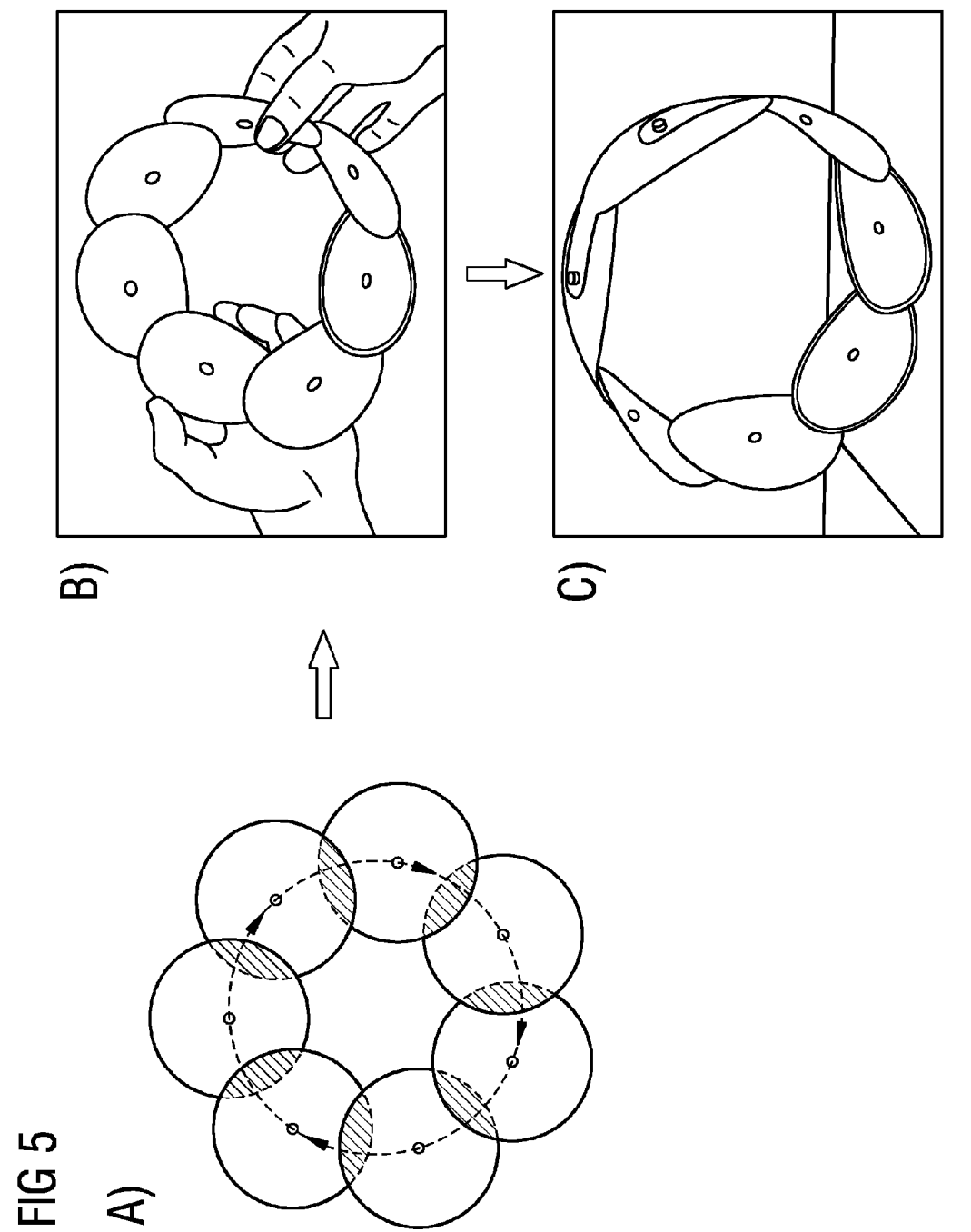
FIGS. 5a-c show perspective views of exemplary spatial folding-over of one embodiment of the local coil shown in FIG. 2, which is closed to form a circle.

FIGS. 5 *a-c* show, as another example, a (closed) annular/circular shape (e.g., for cardiac imaging by placement over the heart area of a patient) of a chain of individual loops SP1, SP2, SP3, SP4, SP5, SP6, SP7. Because of the defined arrangement, an identical overlap of adjacent individual loops SP1, SP2, SP3, SP4, SP5, SP6, SP7 over one another is provided.

Figure 4:
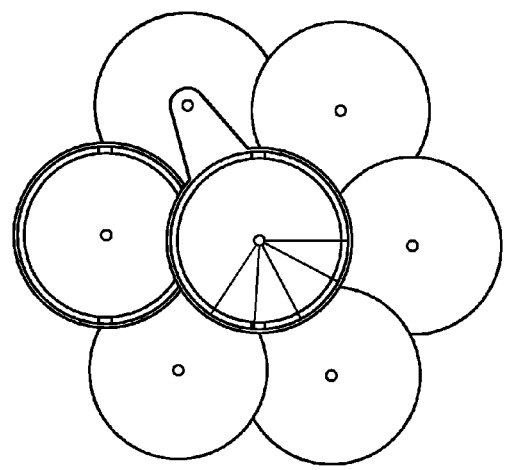
FIG. 4 shows a plan view of one embodiment of a local coil including seven coil elements each connected to one coil element or two coil elements, six coil elements being swiveled such that the six coil elements form a circle, and a seventh coil element is swiveled such that the seventh coil element forms the center of the circle.

FIGS. 5*a-c* show how an annular structure (e.g., approximately in the shape of a headband, ring or collar) may be formed from the flat initial stage as shown in FIG. 4. For this purpose, the opening defined in FIG. 5*a* by the coil elements SP1-SP7 (e.g., defined between the coil elements SP1-SP7) is centrally widened (e.g., when a body part is inserted) and a region (e.g., a region close to the center) of the individual loops is turned outward (e.g., an inner region of the individual loops SP1, SP2, SP3, SP4, SP5, SP6, SP7 is rotated out of the plane of the drawing and radially outward via an intermediate stage as shown in FIG. 5*b* to an end stage as per FIG. 5*c*).

If the individual loops SP1, SP2, SP3, SP4, SP5, SP6, SP7 and connections of the individual loops (e.g., an element interconnecting the individual loops in the form of a bolt or pin ST with increased thickness at ends or a nut-and-bolt pair in cutouts A, D1, D2 in FIGS. 1 and 2) are not rigidly implemented, the individual loops SP1, SP2, SP3, SP4, SP5, SP6, SP7 and connections of the individual loops will be compliant with such a reshaping (FIG. 5*a*-5*b*-5*c*). This annular shape, as shown in FIGS. 5*a*, 5*b*, 5*c*, may be used in a wide variety of body regions.

FIGS. 6a-6d show, as an example, a chain 106 of individual loops SP1, SP2, SP3, SP4, SP5, SP6, SP7 that is closed (e.g., to form a ring in plan view). This enables a (flexible) annular structure to be formed. The annular structure may be pulled over something. This variant is both flat and annular.

For example, as shown in FIGS. 6 a-d, the annular shape may be used, for example, on a shoulder (e.g., as in FIG. 6a) or on a knee (e.g., as in FIG. 6d). The intermediate stage (from FIG. 5b) is similar to a dish without a base and therefore also fits snugly over an ankle, as shown in FIG. 6c), or a knee joint. A foot or a knee may pass through the opening for positioning. Possibilities likewise open up in the head region as shown in FIG. 6b), as the variable ring-like shape of the individual loops SP1, SP2, SP3, SP4, SP5, SP6, SP7 may be placed on a patient's head like a headband.

The present embodiments may advantageously enable an adaptable local coil that is relatively universal in use to be implemented. An arrangement of coil elements that may be rotated in a defined manner allows not only this flexibility but also achieves unchanging decoupling of the coil elements with respect to one another, enabling good and quick adaptation of the coil to suit the body region under examination. A coil may also represent an inexpensive all-purpose variant for an MR system, since, although the coil is not necessarily of exceptionally high quality, the coil may combine a large number of local coils into one.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A local coil for a magnetic resonance tomography system, the local coil comprising:
 a plurality of coil elements,
 wherein a first coil element of the plurality of coil elements has a point of application for a second coil element of the plurality of coil elements, the first coil element being connected to the second coil element in a pivoting manner with respect to the second coil element,
 wherein the first coil element of the plurality of coil elements comprises a circular section in plan view and an oblang connecting element connected to the circular section.

2. The local coil as claimed in claim 1, wherein the first coil element is rotatable about the point of application.

3. The local coil as claimed in claim 1, wherein the first coil element is connected to the second coil element through at least three hundred and sixty degrees about the point of application of the first coil element, and is rotatable through three hundred and sixty degrees or through more than at least three hundred and sixty degrees about the point of application of the first coil element.

4. The local coil as claimed in claim 1, wherein two coil elements of the plurality of coil elements are each connected to only one other coil element of the plurality of coil elements in a rotatable manner about a respective point of application, and
 wherein precisely two coil elements of the plurality of coil elements are connected to only one coil element in a pivoting manner with respect to the one element.

5. The local coil as claimed in claim 1, wherein one or more coil elements of the plurality of coil elements are each connected to precisely two other coil elements of the plurality of coil elements in a pivoting manner with respect to the two other coil elements.

6. The local coil as claimed in claim 1, wherein more than three coil elements of the plurality of coil elements are each connected to precisely two other coil elements of the plurality of coil elements in a pivoting manner.

7. The local coil as claimed in claim 6, wherein more than four coil elements of the plurality of coil elements are each connected to precisely two other coil elements of the plurality of coil elements in a pivoting manner.

8. The local coil as claimed in claim 1, wherein the first coil element of the plurality of coil elements is flat in cross section.

9. The local coil as claimed in claim 8, wherein the first coil element is flat in cross section having a thickness of less than 20% or less than 10% of a maximum length in plan view.

10. The local coil as claimed in claim 1,
 wherein an axis runs through a center point of the oblong connecting element and a center point of the circular section.

11. The local coil as claimed in claim 1, wherein each coil element of the plurality of coil elements has precisely one or two points of application for connection to a point of application of another coil element of the plurality of coil elements.

12. The local coil as claimed in claim 1, wherein the plurality of coil elements comprises more than three coil elements.

13. The local coil as claimed in claim 12, wherein the plurality of coil elements comprises more than five coil elements.

14. The local coil as claimed in claim 1, wherein the point of application comprises a joint.

15. The local coil as claimed in claim 14, wherein the point of application comprises a swivel joint.

16. The local coil as claimed in claim 1, wherein the point of application comprises a through-hole for another coil element of the plurality of coil elements.

17. The local coil as claimed in claim 1, wherein the point of application of the first coil element of the at least two coil elements comprises a first through-cutout,
 wherein the point of application of the second coil element of the at least two coil elements comprises a second through-cutout, and
 wherein an interconnecting element extends through each of the first through-cutout and the second through-cutout and interconnects the first coil element and the second coil element.

18. The local coil as claimed in claim 17, wherein the interconnecting element comprises a pin.

19. The local coil as claimed in claim 1, wherein a coil element of the plurality of coil elements has an antenna.

20. The local coil as claimed in claim 19, wherein the antenna comprises an in cross-section at least approximately circular coil, with which in a magnetic resonance tomography device, a time-variant field is measureable at a location in a region.

21. The local coil as claimed in claim 1, wherein the oblong connecting element is rigidly connected to the circular section of the coil element, and the oblong connecting element and the circular section of the coil element are formed in one piece, or a combination thereof.

22. A local coil for a magnetic resonance tomography system, the local coil comprising:
 a plurality if coil elements;
 wherein each coil element of the plurality of the coil elements comprises an engagement point for a further coil element at which each coil is pivotably connected to the respective further coil element, wherein one coil element of the plurality of coil element comprises a circular part in plan view and an elongated connecting element region, and wherein the elongated connecting element region is rigidly connected to the circular part of the coil element and/or forms one piece with the circular part of the coil element through which the elongated connecting element region an axis extends through a center point of the circular part of the one coil element.

\* \* \* \* \*

UNITED STATES PATENT AND TRADEMARK OFFICE
CERTIFICATE OF CORRECTION

PATENT NO. : 9,046,578 B2  Page 1 of 1
APPLICATION NO. : 13/475971
DATED : June 2, 2015
INVENTOR(S) : Stephan Zink It is certified that error appears in the above-identified patent and that said Letters Patent is hereby corrected as shown below:

In the claims:
Column 6
claim 22, line 65, "if" should be "of"
Column 7
claim 22, line 3, "plurality of coil element" should be "plurality of coil elements"

Signed and Sealed this
Twenty-second Day of September, 2015

Michelle K. Lee
*Director of the United States Patent and Trademark Office*